(12) United States Patent
Liu et al.

(10) Patent No.: US 10,368,454 B2
(45) Date of Patent: Jul. 30, 2019

(54) SHOCK ABSORBING STRUCTURE ADAPTED FOR A CIRCUIT BOARD OF AN ELECTRONIC DEVICE AND ELECTRONIC DEVICE THEREWITH

(71) Applicant: Wistron Corporation, New Taipei (TW)

(72) Inventors: Heng-Min Liu, New Taipei (TW); Chun-Wang Lin, New Taipei (TW); Chin-Chung Hung, New Taipei (TW); Tsung-Hsien Chen, New Taipei (TW); Shih-Wei Tung, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/677,034

(22) Filed: Aug. 15, 2017

(65) Prior Publication Data

US 2018/0270965 A1 Sep. 20, 2018

(30) Foreign Application Priority Data

Mar. 17, 2017 (TW) .............................. 106108853 A

(51) Int. Cl.
*H05K 5/00* (2006.01)
*H05K 5/03* (2006.01)
(Continued)

(52) U.S. Cl.
CPC ......... *H05K 5/0056* (2013.01); *H05K 5/0017* (2013.01); *H05K 5/0021* (2013.01); *H05K 5/0052* (2013.01); *H05K 5/0065* (2013.01); *H05K 5/0217* (2013.01); *H05K 5/0247* (2013.01); *H05K 5/03* (2013.01);
(Continued)

(58) Field of Classification Search
CPC .. H05K 5/0056; H05K 1/0271; H05K 5/0017; H05K 5/0021; H05K 5/0052; H05K 5/0065; H05K 5/0217; H05K 5/0247; H05K 5/03; H05K 5/0204
See application file for complete search history.

(56) References Cited

U.S. PATENT DOCUMENTS 3,688,635 A * 9/1972 Fegen ................... F16B 21/082
174/138 A
6,399,887 B1 * 6/2002 Lin ......................... G06F 1/184
174/138 D (Continued)

FOREIGN PATENT DOCUMENTS

TW I556707 B 11/2016

*Primary Examiner* — Hoa C Nguyen
*Assistant Examiner* — Christopher L Augustin
(74) *Attorney, Agent, or Firm* — Winston Hsu

(57) ABSTRACT

A shock absorbing structure includes at least one protruding column and at least one resilient module. The at least one protruding column is fixed on an electronic device and passes through a circuit board of the electronic device. The at least one resilient module is disposed between the at least one protruding column and the circuit board. When the electronic device is affected by an external shock load, the at least one resilient module is forced by the circuit board to be deformed for generating a resilient force. When the at least one resilient module is not forced by the circuit board any more, the resilient force generated by the at least one resilient module drives the circuit board to recover.

15 Claims, 12 Drawing Sheets

(51) Int. Cl.
*H05K 5/02* (2006.01)
*H05K 1/02* (2006.01)

(52) U.S. Cl.
CPC ......... *H05K 1/0271* (2013.01); *H05K 5/0204* (2013.01); *H05K 2201/09063* (2013.01); *H05K 2201/10409* (2013.01)

(56) References Cited

U.S. PATENT DOCUMENTS

| | | | | |
|---|---|---|---|---|
| 6,399,888 | B1* | 6/2002 | Chen | H05K 7/142 174/138 G |
| 6,420,652 | B1* | 7/2002 | Byczek | H05K 5/0073 174/152 R |
| 2003/0201120 | A1* | 10/2003 | Forte | H05K 7/142 174/255 |
| 2006/0077642 | A1* | 4/2006 | Estes | H05K 7/142 361/752 |
| 2008/0105816 | A1* | 5/2008 | Liang | G06F 1/183 248/680 |
| 2009/0237893 | A1* | 9/2009 | Yang | H05K 7/142 361/748 |
| 2010/0142166 | A1* | 6/2010 | Chang | G06F 1/1616 361/759 |
| 2012/0168578 | A1* | 7/2012 | Peng | H05K 7/142 248/201 |
| 2012/0217361 | A1* | 8/2012 | Kuo | H05K 7/142 248/222.13 |
| 2016/0131178 | A1* | 5/2016 | Shiba | H05K 7/1418 411/368 |
| 2017/0181309 | A1* | 6/2017 | Yi | H05K 7/1417 |

* cited by examiner

SHOCK ABSORBING STRUCTURE ADAPTED FOR A CIRCUIT BOARD OF AN ELECTRONIC DEVICE AND ELECTRONIC DEVICE THEREWITH

BACKGROUND OF THE INVENTION

1. Field of the Invention

The present disclosure relates to a shock absorbing structure and an electronic device, and more particularly, to a shock absorbing structure adapted for a circuit board of an electronic device, and an electronic device having the aforementioned shock absorbing structure.

2. Description of the Prior Art

An electronic device with two electronic modules, such as a host module and a display module, always have two corresponding electrical connectors, which are connected with each other. However, when such electronic device is affected by an environmental vibration, a stress is generated between the two electrical connectors accordingly. When the stress is greater than a connecting strength between the electrical connector and a circuit board, the electrical connector and the circuit board may be forced to separate from each other. For example, when the stress is greater than a soldering strength between the electrical connector and the circuit board, it might result in a solder joint crack, which causes malfunction of the electronic device. Furthermore, the two electrical connectors are usually not completely aligned with each other due to assembly error. Therefore, in order to connect the two electrical connectors, it usually utilizes guiding structures to guide the two electrical connectors to be aligned with each other. However, the stress will be generated between the two electrical connectors due to a pulling and dragging force between the electrical connectors for correcting a misaligned connection, which also may cause the solder joint crack and malfunction of the electronic device.

SUMMARY OF THE INVENTION

Therefore, it is an objective of the present disclosure to provide a shock absorbing structure adapted for a circuit board of an electronic device, and an electronic device having the aforementioned shock absorbing structure for solving the aforementioned problems.

In order to achieve the aforementioned objective, the present disclosure discloses a shock absorbing structure adapted for a circuit board of an electronic device. The shock absorbing structure includes at least one protruding column and at least one resilient module. The at least one protruding column is fixed on the electronic device and passing through the circuit board. The at least one resilient module is disposed between the at least one protruding column and the circuit board. When the electronic device is forced to vibrate by an external impact, the circuit board presses the at least one resilient module, so that the at least resilient module is deformed to generate a resilient force. The resilient force drives the circuit board to recover when the circuit board does not press the at least one resilient module.

According to an embodiment of the disclosure, the shock absorbing structure further includes at least one fastening component and at least one washer. The at least one fastening component is fastened onto the at least one protruding column. The at least one washer is disposed between the at least one fastening component and the at least one protruding column. A gap is formed between the at least one resilient module and the at least one washer. The circuit board is disposed between the at least one washer and the at least one resilient module.

According to an embodiment of the disclosure, the at least one protruding column includes a fixing portion and a protruding portion connected to the fixing portion. The fixing portion is fixed onto the electronic device. The protruding portion passes through the circuit board. The at least one resilient module includes a first resilient component sleeved on the protruding portion and passing through the circuit board. A side of the first resilient component abuts against the fixing portion.

According to an embodiment of the present disclosure, the at least one resilient module further includes a second resilient component sleeved on the first resilient component and abutting between the fixing portion and the circuit board. The second resilient component is pressed to be deformed by the circuit board when the circuit board moves along a first direction. The first resilient component is pressed to be deformed by the circuit board when the circuit board moves along a second direction perpendicular to the first direction.

According to an embodiment of the present disclosure, the shock absorbing structure further includes at least one fastening component and at least one washer. The at least one fastening component is fastened onto the protruding portion of the at least one protruding column. The at least one washer is disposed between the at least one fastening component and the protruding portion of the at least one protruding column. A gap is formed between the first resilient component and the at least one washer. The circuit board is disposed between the at least one washer and the second resilient component.

According to an embodiment of the present disclosure, a height of the protruding portion along the first direction is greater than a height of the first resilient component along the first direction.

According to an embodiment of the present disclosure, a sum of a height of the second resilient component along the first direction and a height of the circuit board along the first direction is less than the height of the protruding portion along the first direction.

According to an embodiment of the present disclosure, the protruding portion protrudes from the fixing portion. An inner periphery of the first resilient component is sleeved on and at least partially covers the protruding portion. The second resilient component is sleeved on and partially covers an outer periphery of the first resilient component opposite to the inner periphery of the first resilient component.

In order to the aforementioned objective, the present disclosure further discloses an electronic device. The electronic device includes a first electronic module, a second electronic module, and a shock absorbing structure. The first electronic module includes a first circuit board and a first electrical connector. The second electronic module includes a second circuit board and a second electrical connector. The shock absorbing structure is for reducing a stress between the first electrical connector and the second electrical connector when the first electrical connector is connected with the second electrical connector. The shock absorbing structure includes at least one protruding column and at least one resilient module. The at least one protruding column is fixed on the second electronic module and passing through the second circuit board. The at least one resilient module is disposed between the at least one protruding column and the second circuit board. When the electronic device is forced to vibrate by an external impact, the second circuit board presses the at least one resilient module, so that the at least resilient module is deformed to generate a resilient force. The resilient force drives the second circuit board to recover when the second circuit board does not press the at least one resilient module.

According to an embodiment of the present disclosure, the electronic device further includes at least one first positioning structure and at least one second positioning structure. The at least one first positioning structure is disposed on the first electronic module. The at least one second positioning structure is disposed on the second electronic module. The first electronic module and the second electronic module are aligned with each other by cooperation of the at least one first positioning structure and the at least one second positioning structure.

According to an embodiment of the present disclosure, the electronic device further includes two fixing brackets and two fixing rods. The two fixing brackets are disposed on two sides of the second electronic module. A fixing slot is formed on each of the two fixing brackets. The two fixing rods are disposed on two sides of the first electronic module and located at positions corresponding to the two fixing brackets. The first electronic module is pivotally connected to the second electronic module by engagement of the two fixing rods and the two fixing slots on the two fixing brackets. The first electronic module is allowed to separate from the second electronic module by disengagement of the two fixing rods and the two fixing slots on the two fixing brackets.

According to an embodiment of the present disclosure, the second electronic module further includes a display assembly and a back cover covering the display assembly. The second circuit board is installed on the display assembly or on an inner side of the back cover facing the display assembly.

In summary, in the present disclosure, no matter when the first electrical connector and the second electrical connector, which are connected to each other, are affected by the external impact to vibrate or when the first electrical connector and the second electrical connector are not aligned with each other due to assembly error before connection, the second circuit board can be driven to move along the first direction and/or the second direction to press the second resilient component and/or the first resilient component for reducing the stress between the first electrical connector and the second electrical connector, which prevents contact fault, such as solder joint cracks, between the first electrical connector and the first circuit board and between the second electrical connector and the second circuit board, due to a pulling and dragging force of the first electrical connector and the second electrical connector, and ensures that the electronic device can operate normally. Furthermore, when the first electrical connector separates from the second electrical connector, the pressed first resilient component and/or the pressed second resilient component can drive the second circuit board and the second electrical connector to recover. Therefore, it ensures the second electrical connector can be connected to another electrical connector of another electronic module, which is not affected by the previous moving distance.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
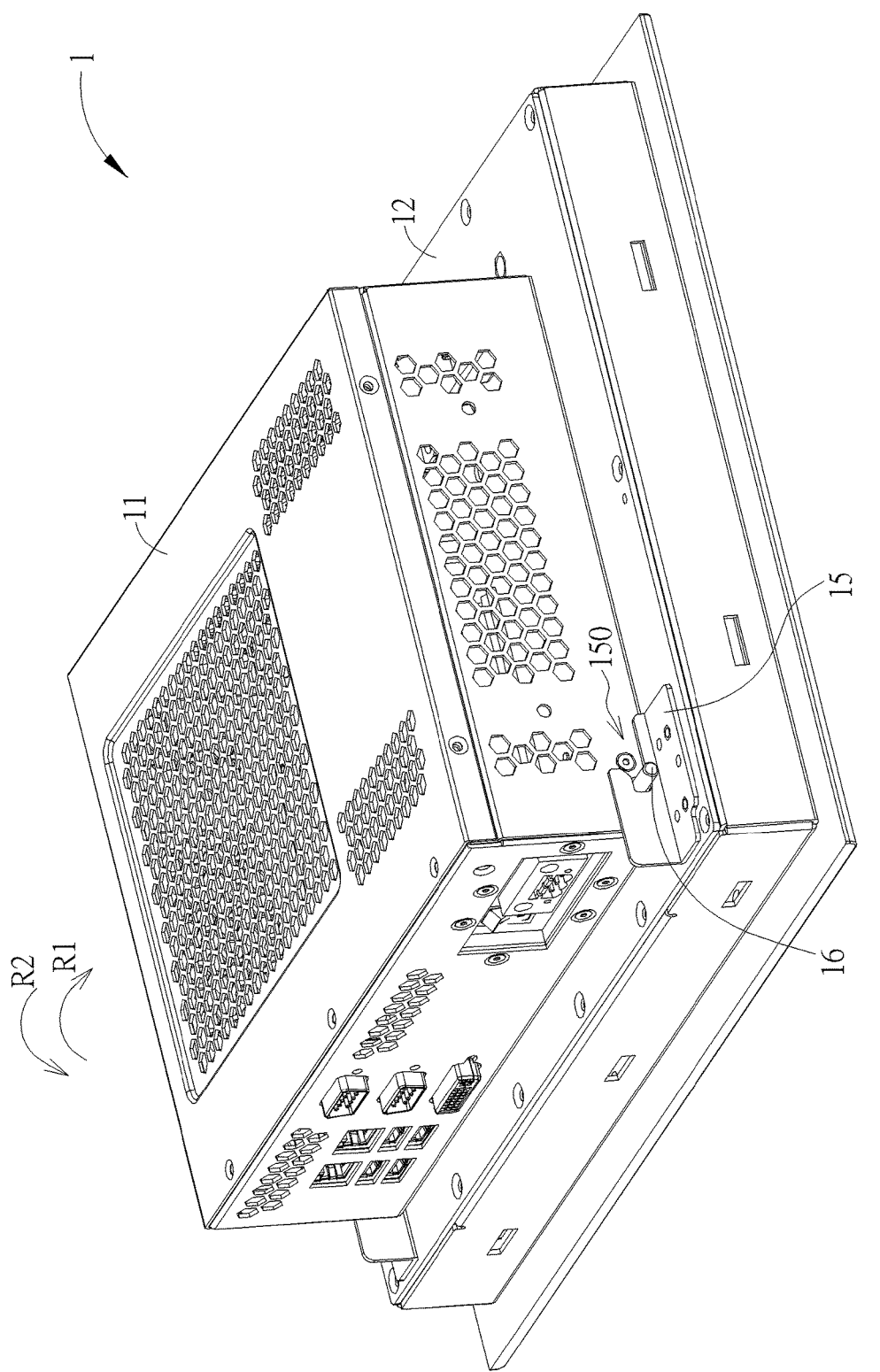
FIG. 1 and FIG. 2 are schematic diagrams of an electronic device at different views according to a first embodiment of the present disclosure.
Figure 2:
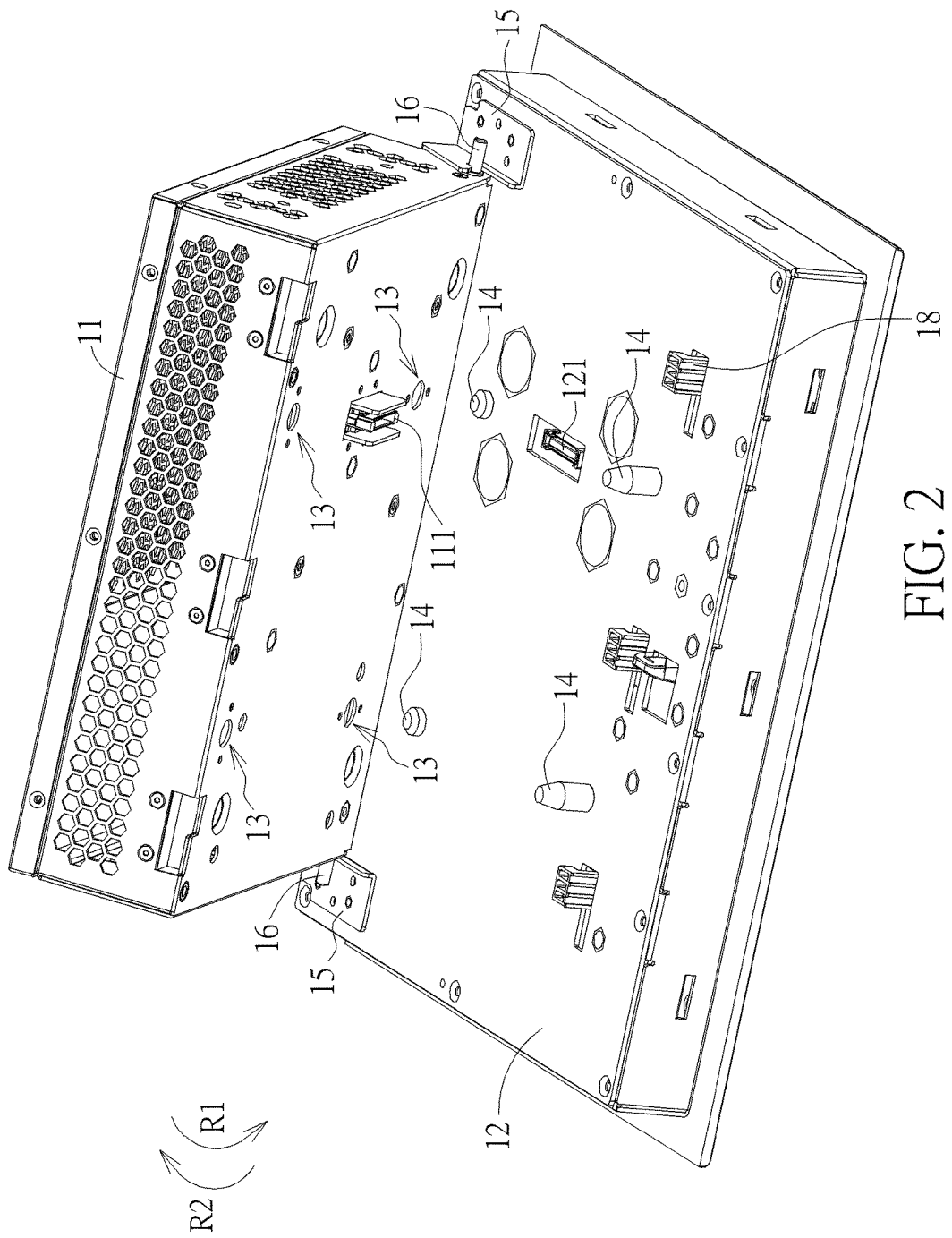
Figure 3:
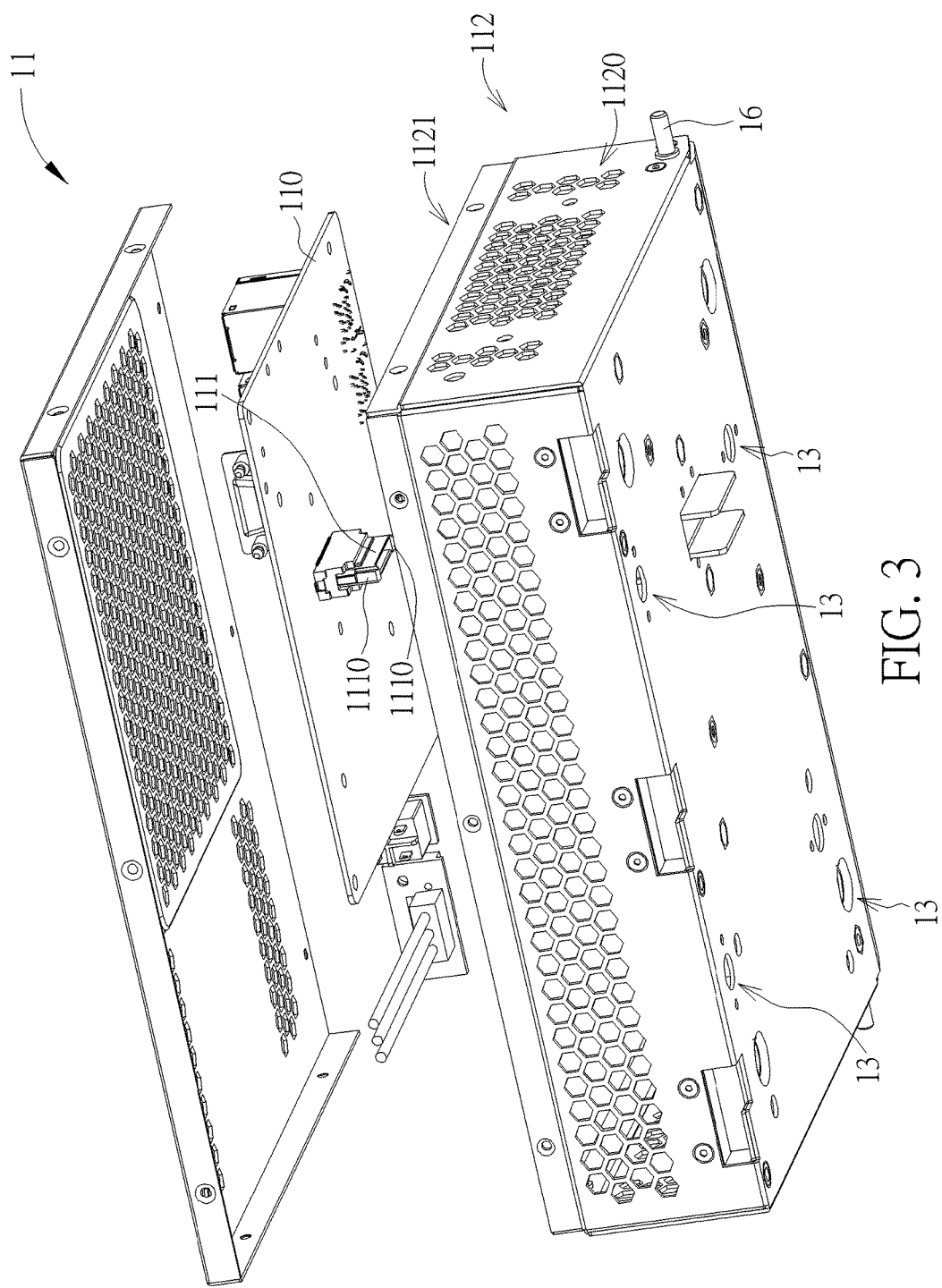
FIG. 3 is a partial exploded diagram of a first electronic module according to the first embodiment of the present disclosure.
Figure 4:
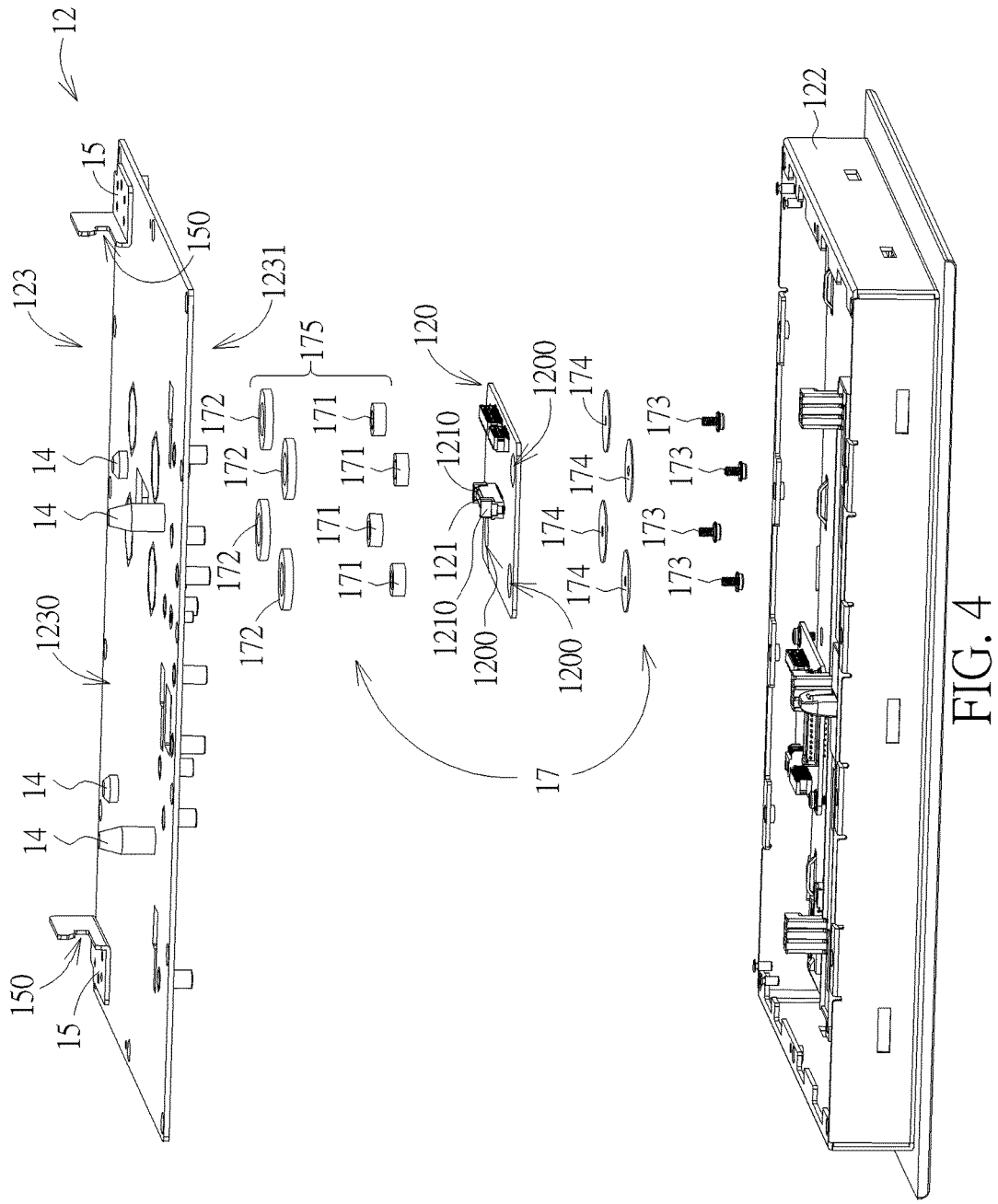
FIG. 4 and FIG. 5 are partial exploded diagrams of a second electronic module according to the first embodiment of the present disclosure.
Figure 5:
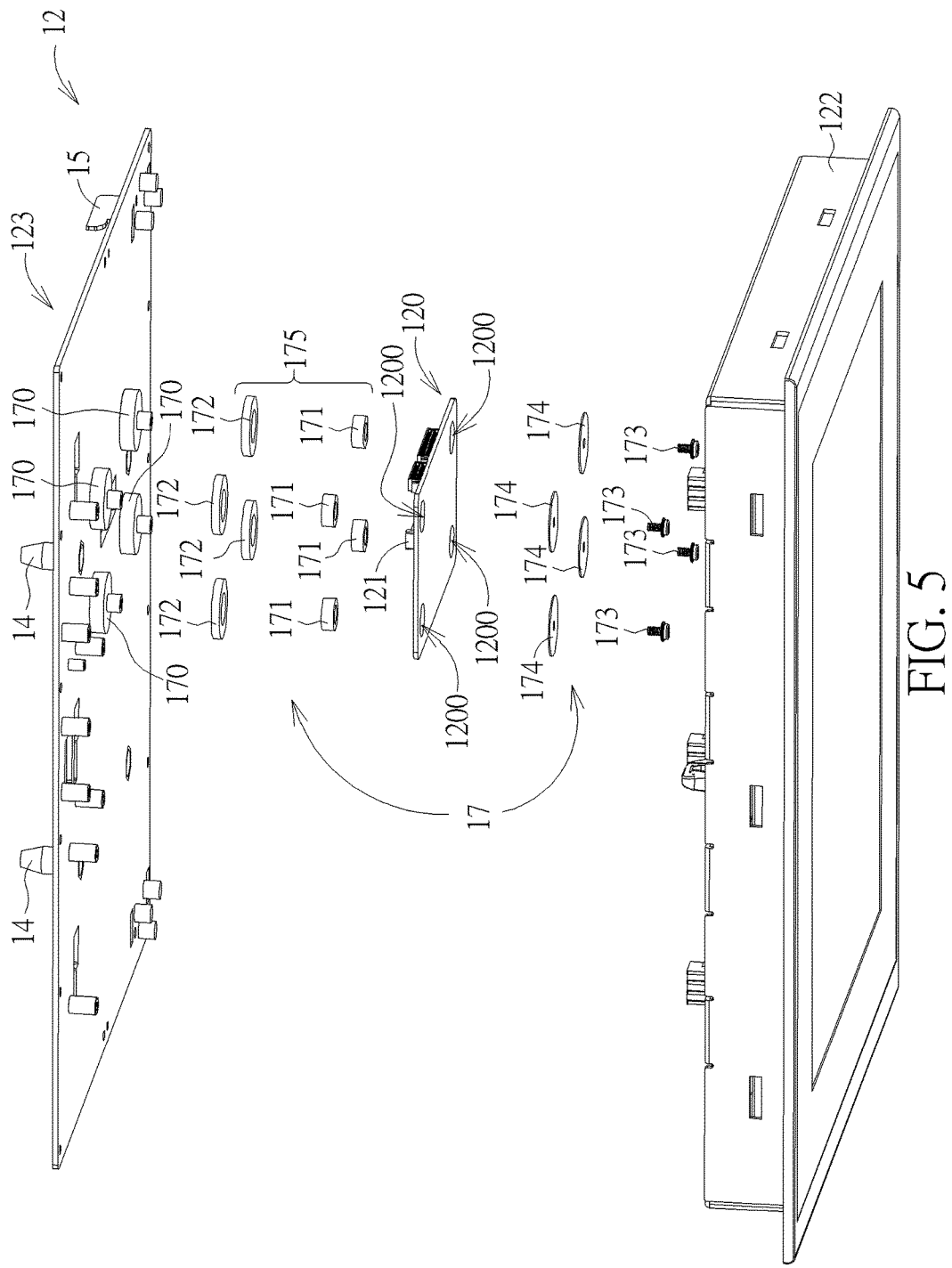

Please refer to FIG. 1 to FIG. 5. FIG. 1 and FIG. 2 are schematic diagrams of an electronic device 1 at different views according to a first embodiment of the present disclosure. FIG. 3 is a partial exploded diagram of a first electronic module 11 according to the first embodiment of the present disclosure. FIG. 4 and FIG. 5 are partial exploded diagrams of a second electronic module 12 according to the first embodiment of the present disclosure. As shown in FIG. 1 to FIG. 5, the electronic device 1 includes the first electronic module 11, the second electronic module 12, four first positioning structures 13, four second positioning structures 14, two fixing brackets 15, two fixing rods 16, a shock absorbing structure 17, and a latch component 18. In this embodiment, the electronic device 1 can be a computer device, the first electronic module 11 can be a host module, the second electronic module 12 can be a display module, the first positioning structure 13 can be a positioning hole, and the second positioning structure 14 can be a positioning column. However, it is not limited thereto.

The first electronic module 11 includes a first circuit board 110, a first electrical connector 111, and a housing 112. The four first positioning structures 13 are disposed on an outer side 1120 of the housing 112. The two fixing rods 16 are respectively disposed on two edges of the outer side 1120 of the housing 112 of the first electronic module 11. The second electronic module 12 includes a second circuit board 120, a second electrical connector 121, a display assembly 122, and a back cover 123. The back cover 123 is for covering the display assembly 122. The two fixing brackets 15 are respectively disposed on two edges of an outer side 1230 of the back cover 123 of the second electronic module 12 and located at positions corresponding to the two fixing rods 16. A fixing slot 150 is formed on each of the two fixing brackets 15 and for engaging with the corresponding fixing rod 16. The four second positioning structures 14 are fixed on the outer side 1230 of the back cover 123 and located at positions corresponding to the four first positioning structures 13. The latch component 18 is slidably disposed on the second electronic module 12 and for engaging with the first electronic module 11.

When it is desired to combine the first electronic module 11 and the second electronic module 12, firstly, the two fixing rods 16 of the first electronic module 11 can be operated to engage with the two fixing slots 150 of the second electronic module 12 to allow the first electronic module 11 to pivot relative to the second electronic module 12. Then, the first positioning structures 13 can cooperate with the second positioning structures 14 to align the first electronic module 11 with the second electronic module 12 when the first electronic module 11 pivots toward the second electronic module 12 along a first pivoting direction R1. When the first electronic module 11 is attached onto the second electronic module 12, the latch component 18 can be operated to engage with the first electronic module 11, so as to prevent the first electronic module 11 from pivotally detaching away from the second electronic module 12 along a second pivoting direction R2 opposite to the first pivoting direction R1.

On the other hand, when it is desired to separate the first electronic module 11 from the second electronic module 12, the latch component 18 can be operated to disengage from the first electronic module 11. Afterwards, the first electronic module 11 can be operated to pivotally detach away from the second electronic module 12 along the second pivoting direction R2. At the same time, the four first positioning structures 13 disengage from the four second positioning structures 14. At last, as long as the two fixing rods 16 are operated to disengage from the two fixing slots 150, the first electronic module 11 can separate from the second electronic module 12.

Furthermore, as shown in FIG. 3 to FIG. 5, the first electrical connector 111 is fixed onto the first circuit board 110 and has two first guiding structures 1110. The first circuit board 110 is installed on an inner side 1121 of the housing 112 opposite to the outer side 1120. The second electrical connector 121 is fixed onto the second circuit board 120 and has two second guiding structures 1210. The second circuit board 120 is installed on an inner side 1231 of the back cover 123 opposite to the outer side 1230. The shock absorbing structure 17 is disposed between the second circuit board 120 and the inner side 1231 of the back cover 123 for allowing the second circuit board 120 to move relative to the back cover 123 to compensate a misalignment between the first electrical connector 111 and the second electrical connector 121 caused by assembly error, which reduces a stress between the first electrical connector 111 and the second electrical connector 121 when the first electrical connector 111 is connected to the second electrical connector 121.

Figure 6:
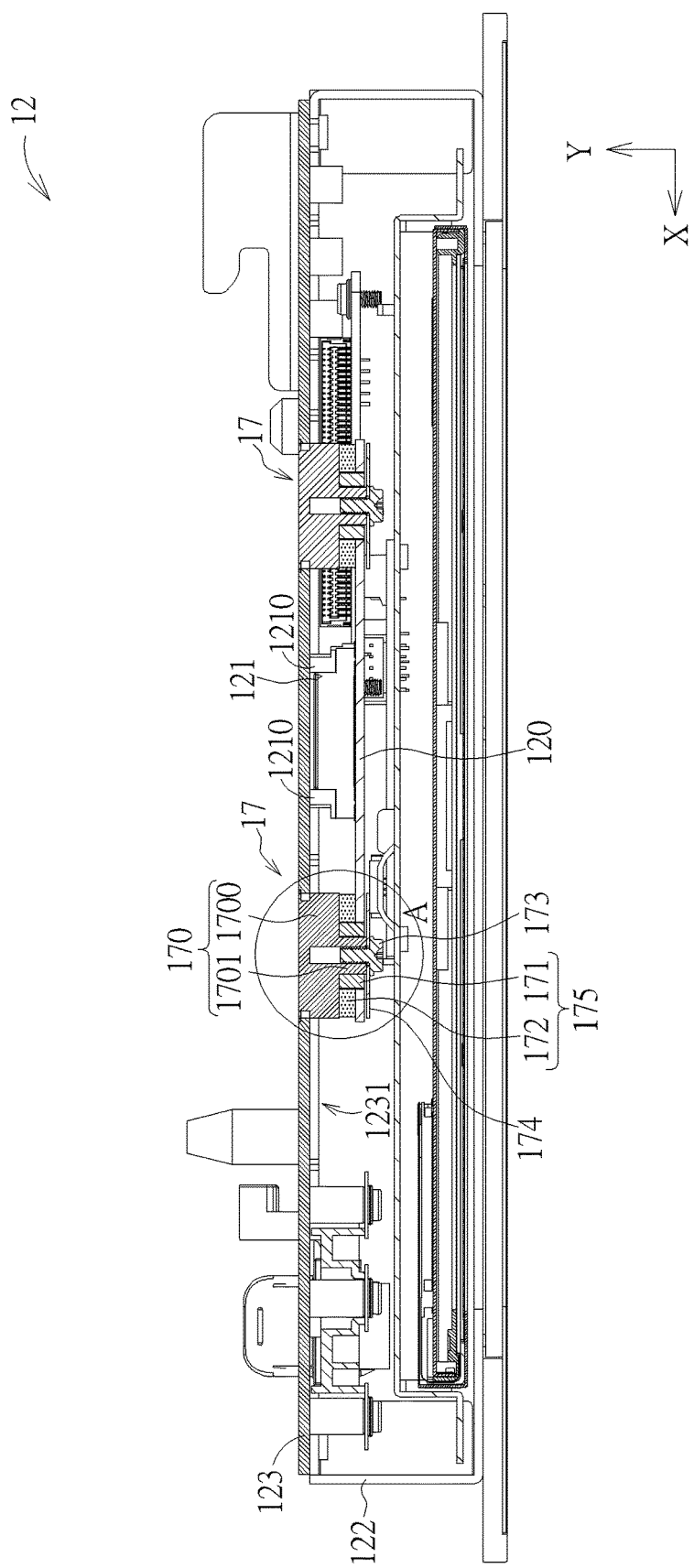
FIG. 6 is a sectional diagram of the second electronic module according to the first embodiment of the present disclosure.
Figure 7:
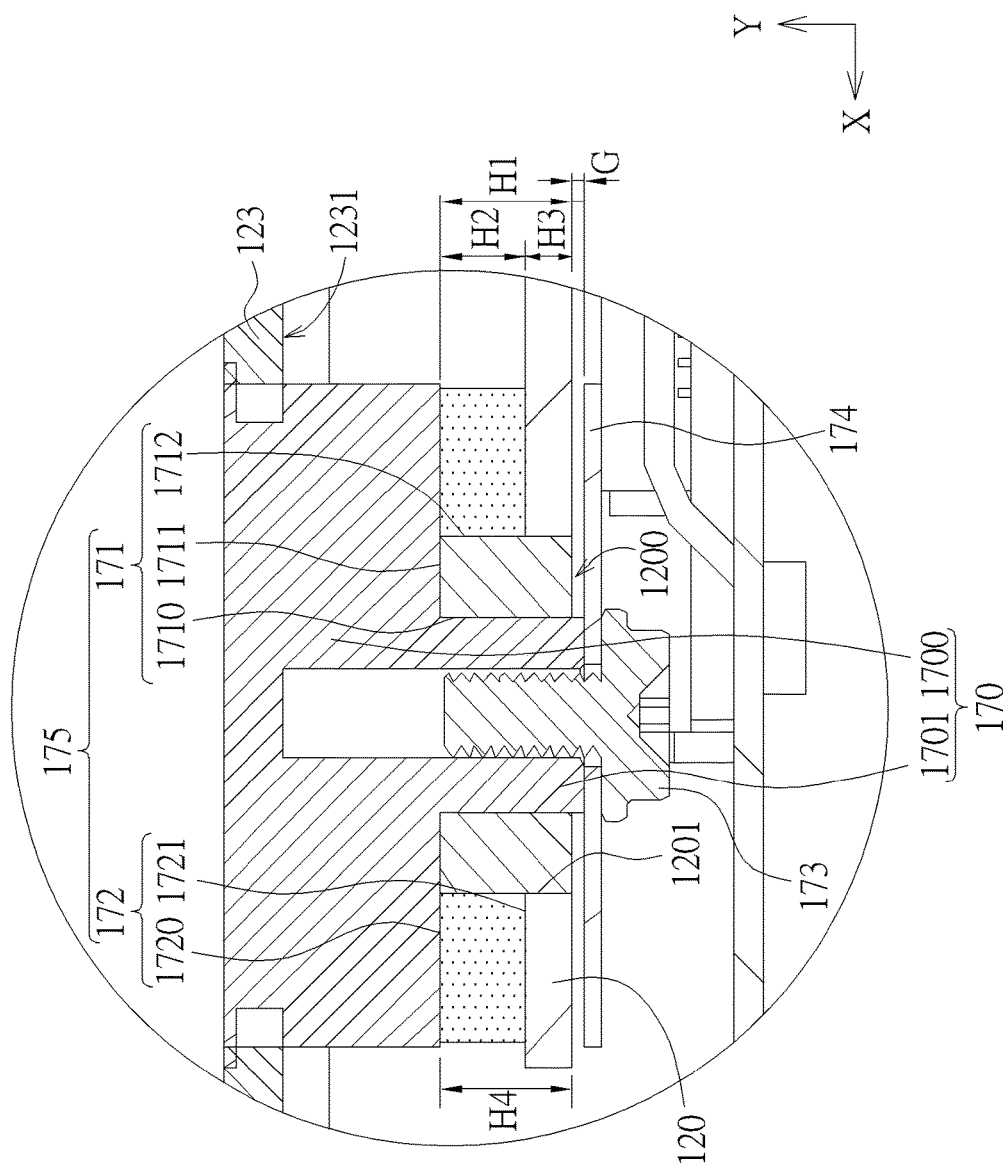
FIG. 7 is an enlarged diagram of an A portion of the second electronic module shown in FIG. 6 according to the first embodiment of the present disclosure.

Please refer to FIG. 6 and FIG. 7. FIG. 6 is a sectional diagram of the second electronic module 12 according to the first embodiment of the present disclosure. FIG. 7 is an enlarged diagram of an A portion of the second electronic module 12 shown in FIG. 6 according to the first embodiment of the present disclosure. As shown in FIG. 4 to FIG. 7, four holes 1200 are formed on the second circuit board 120. The shock absorbing structure 17 includes four protruding columns 170, four resilient modules 175, four fastening components 173, and four washers 174. Each of the four protruding columns 170 includes a fixing portion 1700 and a protruding portion 1701. The fixing portion 1700 is fixed onto the inner side 1231 of the second electronic module 12. The protruding portion 1701 is connected to and protrudes from the fixing portion 1700.

Each of the four resilient modules 175 includes a first resilient component 171 and a second resilient component 172. An inner periphery 1710 of the first resilient component 171 is sleeved on and at least partially covers the corresponding protruding portion 1701. A side 1711 of each of the four first resilient components 1711 abuts against the corresponding fixing portion 1700. Each of the four protruding portions 1710 and the corresponding first resilient component 171 pass through the corresponding hole 1200 on the second circuit board 120, so that an outer periphery 1712 of each of the four first resilient components 171 opposite to the inner periphery 1710 abuts an inner wall 1201 of the corresponding hole 1200. Each of the four second resilient components 172 is sleeved on and at least partially covers the outer periphery 1712 of the corresponding first resilient component 171. A side 1720 of each of the four second resilient components 172 abuts against the corresponding fixing portion 1700. Another side 1721 of the second resilient component 172 opposite to the side 1720 abuts against the second circuit board 120. Each of the four fastening components 173 is fastened onto the protruding portion 1701 of the corresponding protruding column 170 passing through the corresponding hole 1200. Each of the four washers 174 is disposed between a corresponding head portion of the fastening component 173 and the protruding portion 1701 of corresponding protruding column 170. When the first electrical connector 111 is connected to the second electrical connector 121 and the second circuit board 120 is forced by an external impact along a first direction Y, the second circuit board 120 can be driven to move along the first direction Y to press the second resilient component 172 to be deformed for absorbing the external impact and reducing the stress between the first electrical connector 111 and the second electrical connector 121. When the first electrical connector 111 is connected to the second electrical connector 121 and the second circuit board 120 is forced by another external impact along a second direction X perpendicular to the first direction Y, the second circuit board 120 can be driven to move along the second direction X to press the first resilient components 171 for absorbing the another external impact and reducing the stress between the first electrical connector 111 and the second electrical connector 121.

In this embodiment, a sum of a height H2 of the second resilient component 172 along the first direction Y and a height H3 of the second circuit board 120 along the first direction Y can be preferably less than a height H4 of the protruding portion 1701 along the first direction Y when the first electrical connector 111 is connected to the second electrical connector 121 and the electronic device 1 has been not affected by any external impact yet. Therefore, the washer 174 does not contact with the first resilient component 171 and the second circuit board 120 when the fastening component 173 is fastened onto the protruding portion 1701 of the protruding column 170 passing through the hole 1200 and the washer 174 is disposed between the fastening component 173 and the protruding portion 1701 of the protruding column 170. For example, as shown in FIG. 7, a gap G is formed between the washer 174 and the first resilient component 171 and between the washer 174 and the second circuit board 120. In such a way, it prevents the first resilient component 171 and the second resilient component 172 from generating a resistance force restraining the second circuit board 120 from moving due to restraint of the washer 174.

Figure 8:
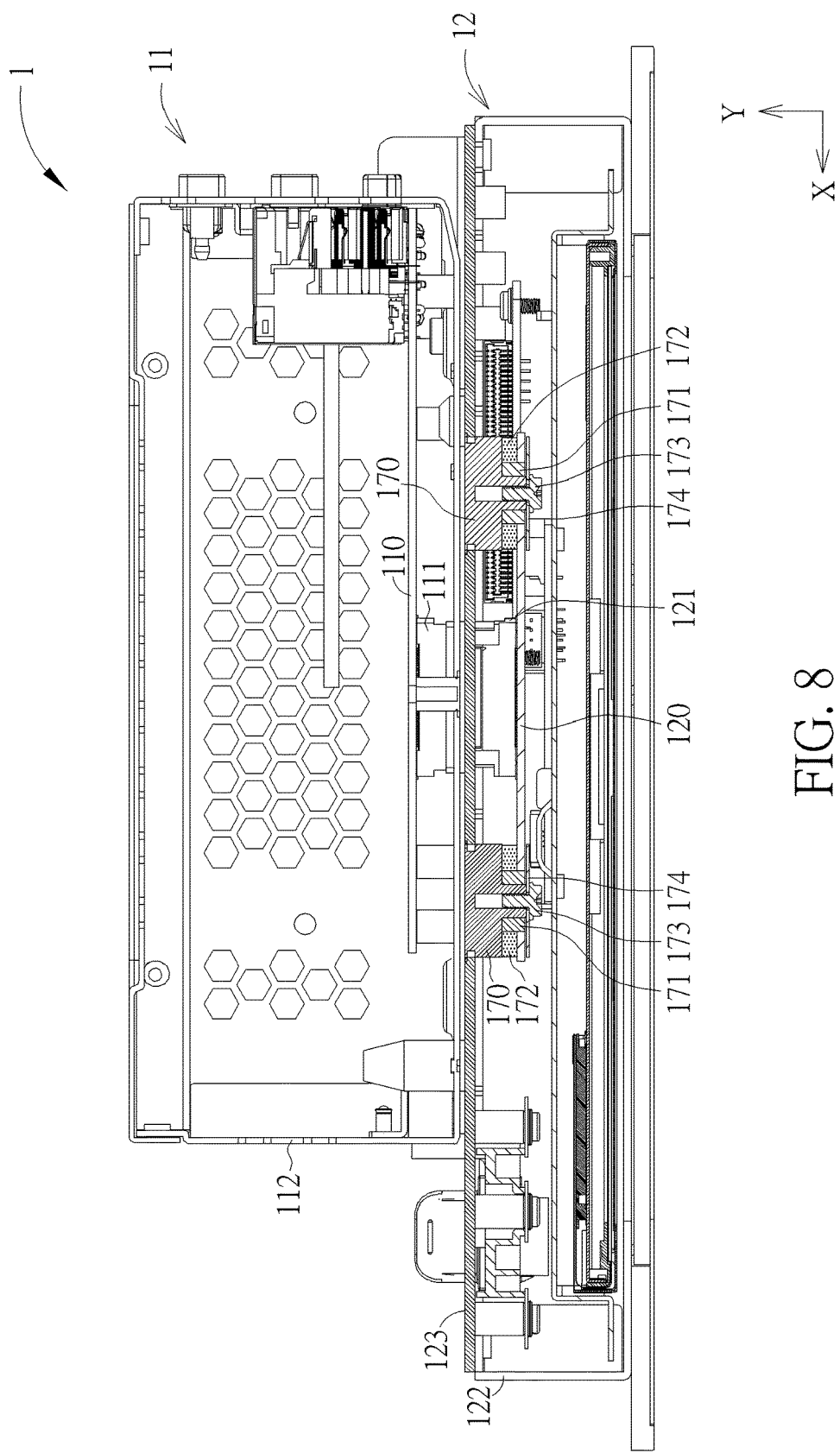
FIG. 8 to FIG. 10 are diagrams of the second electronic module at different states according to the first embodiment of the present disclosure.
Figure 9:
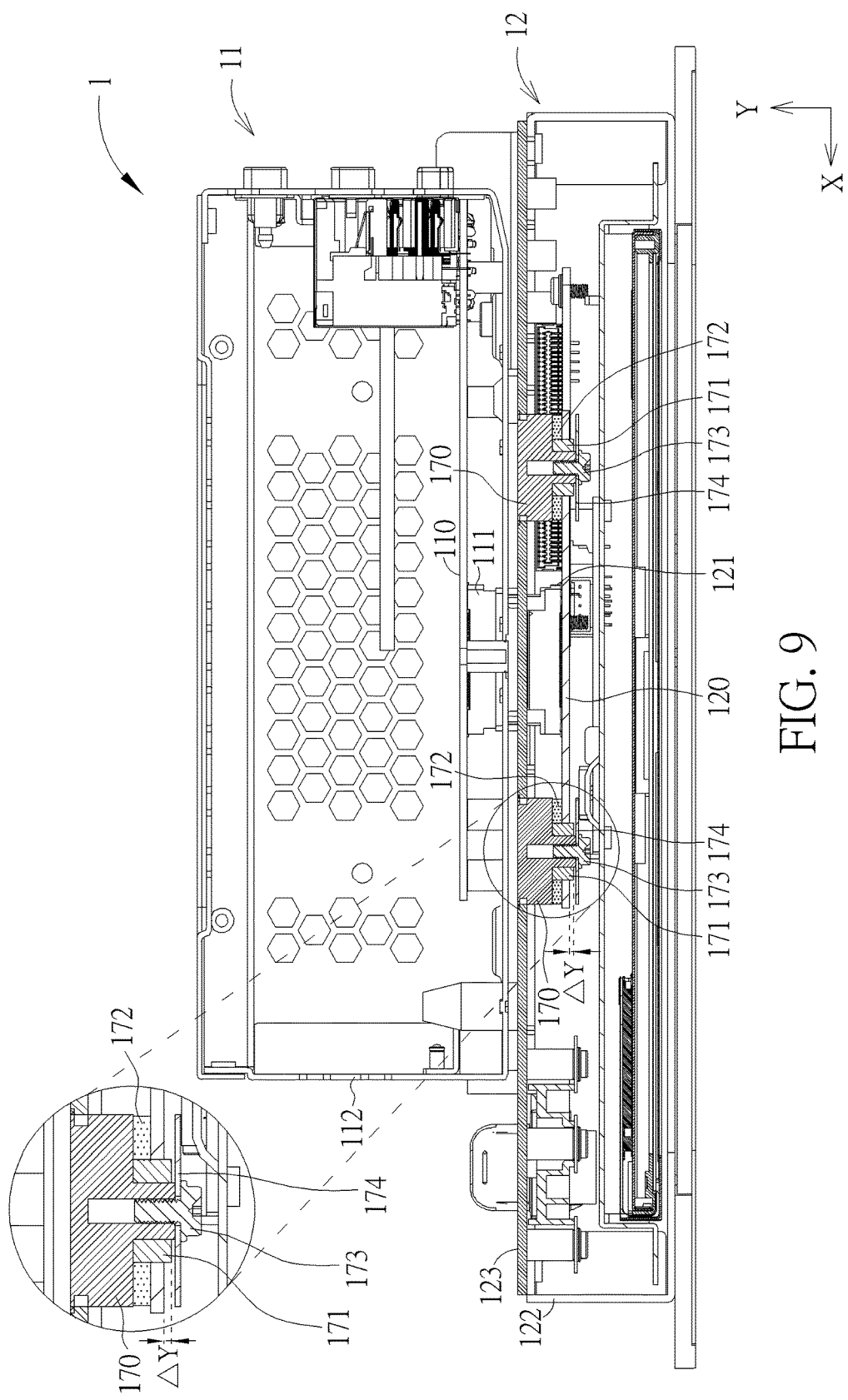
Figure 10:
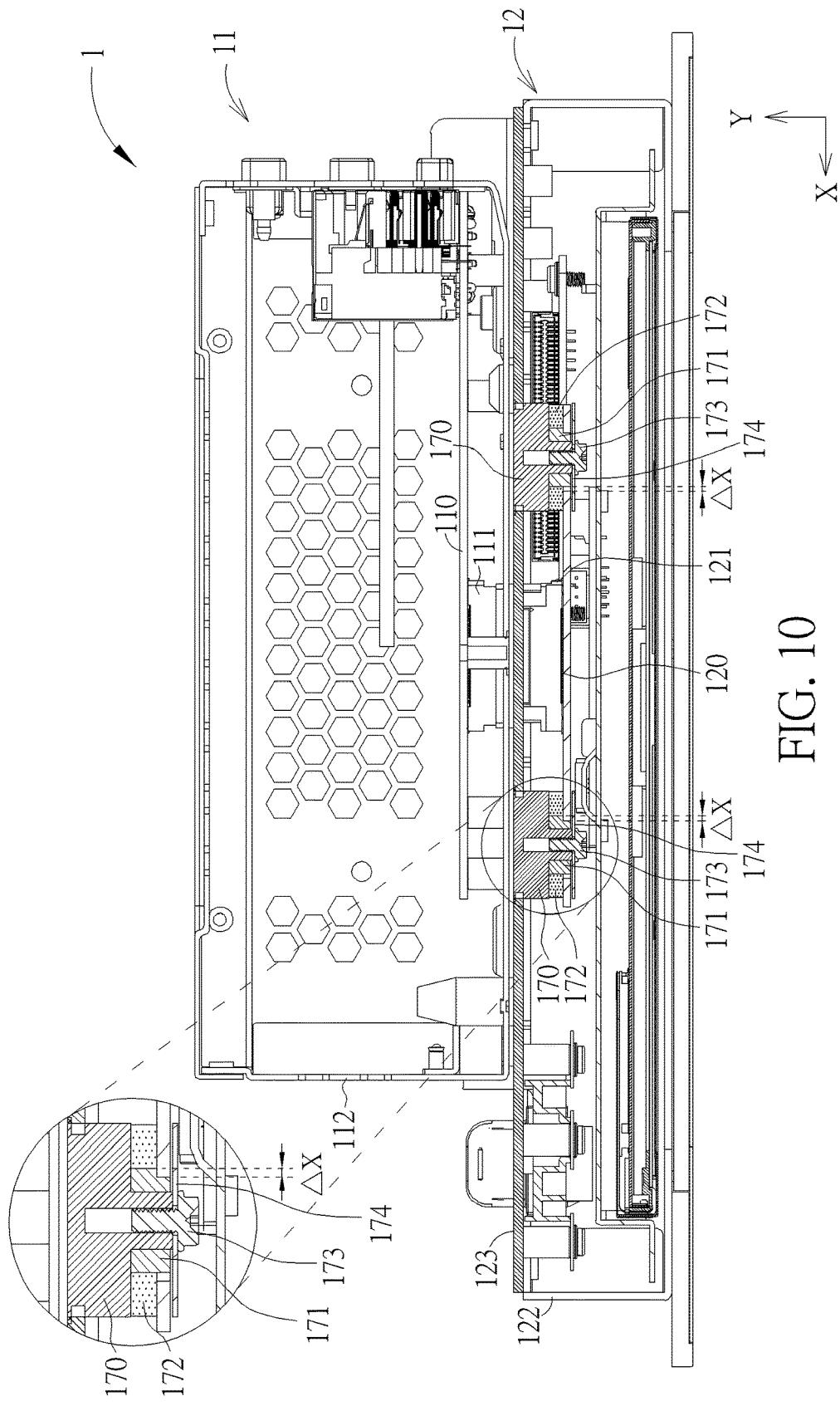

Please refer to FIG. 8 to FIG. 10. FIG. 8 to FIG. 10 are diagrams of the second electronic module 12 at different states according to the first embodiment of the present disclosure. For example, when the first electrical connector 111 is aligned with and then connected to the second electrical connector 121, the second circuit board 120 can be located at a position, as shown in FIG. 8. At this moment, the first electrical connector 111 and the second electrical connector 121 are aligned with each other completely, so that the second circuit board 120 is neither driven to move along the first direction Y to press the second resilient component 172 nor to move along the second direction X to press the first resilient component 171. As shown in FIG. 9, when the electronic device 1 is forced by an external impact, the first electronic module 11 is driven to move relative to the second electronic module 12 by a displacement ΔY, so that the second electrical connector 121 and the second circuit board 120 are driven by the first electrical connector 111 to move relative to the back cover 123 along the first direction Y. At this moment, the second resilient component 172 is forced to be deformed by the second circuit board 120 moving along the first direction Y, so that moving distances of the second electrical connector 121 and the second circuit board 120 along the first direction Y are equal to the displacement ΔY of the first electronic module 11 relative to the second electronic module 12 along the first direction Y. In such a way, it absorbs the external impact and reduces the stress between the first electrical connector 111 and the second electrical connector 121 and further prevents contact fault, such as solder joint cracks, between the first electrical connector 111 and the first circuit board 110 and between the second electrical connector 121 and the second circuit board 120, due to a pulling and dragging force of the first electrical connector 111 and the second electrical connector 121, which ensures that the electronic device 1 can operate normally.

Furthermore, as shown in FIG. 10, when the first electronic module 11 is driven by an external impact to move relative to the second electronic module 12 along the second direction X by a displacement ΔX, the second electrical connector 121 and the second circuit board 120 are driven by the first electrical connector 111 to move relative to the back cover 123 along the second direction X. At this moment, the first resilient component 171 is pressed to be deformed by the second circuit board 120 moving along the second direction X, so that the moving distances of the second electrical connector 121 and the second circuit board 120 along the second direction X are equal to the displacement ΔX of the first electronic module 11 relative to the second electronic module 12 along the second direction X. In such a way, it absorbs the external impact and reduces the stress between the first electrical connector 111 and the second electrical connector 121 and further prevents the contact fault, such as solder joint cracks, between the first electrical connector 111 and the first circuit board 110 and between the second electrical connector 121 and the second circuit board 120, due to the pulling and dragging force of the first electrical connector 111 and the second electrical connector 121, which ensures that the electronic device 1 can operate normally.

Figure 11:
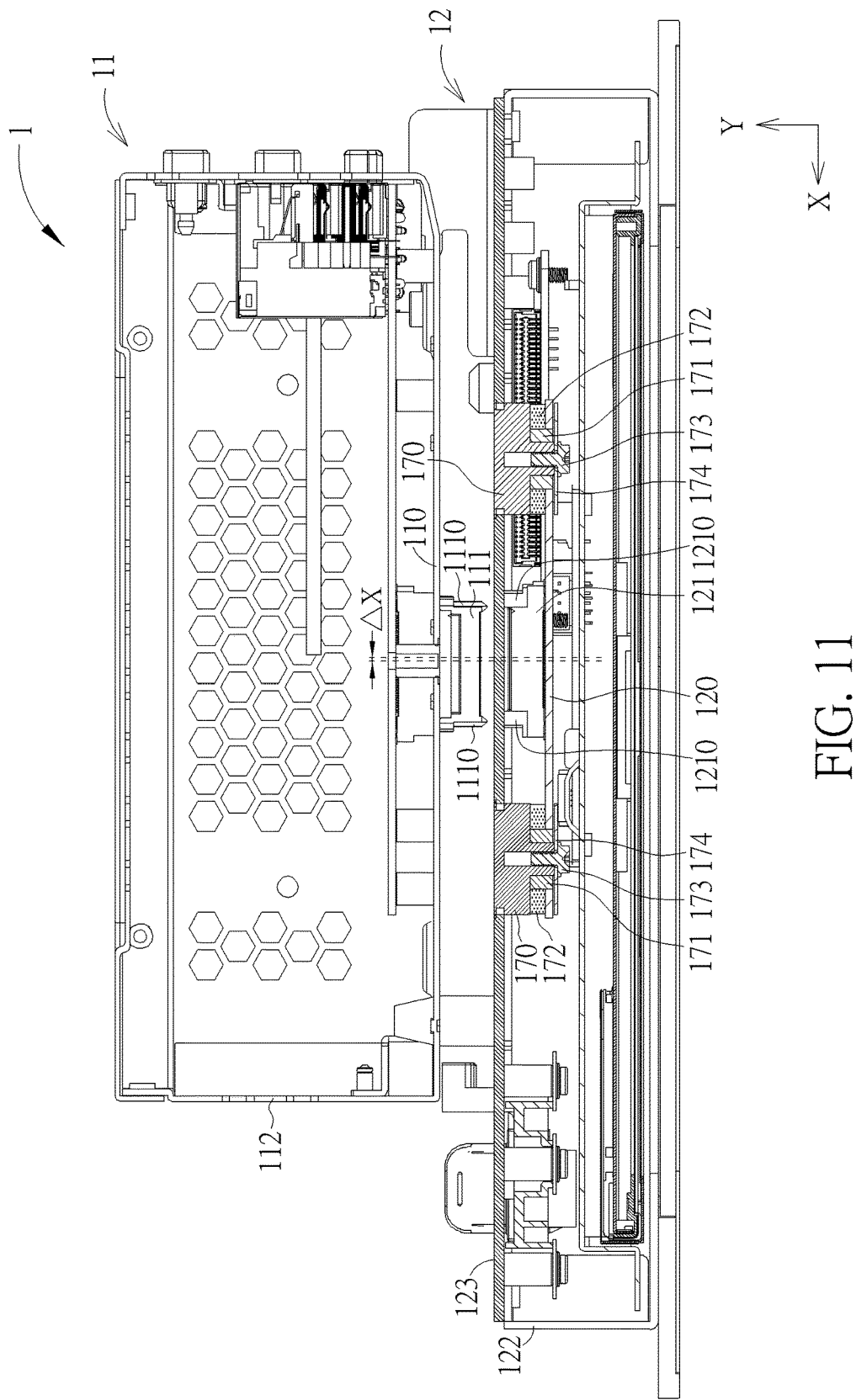
FIG. 11 is a diagram illustrating that the first electronic module and the second electronic module are to be connected to each other according to the first embodiment of the present disclosure.

Moreover, please refer to FIG. 11. FIG. 11 is a diagram illustrating that the first electronic module 11 and the second electronic module 12 are to be connected to each other according to the first embodiment of the present disclosure. When it is desired to connect the first electrical connector 111 and the second electrical connector 121 which are not completely aligned with each other due to assembly error, the first electrical connector 111 can drive the second electrical connector 121 and the second circuit board 120 to move by cooperation of the first guiding structures 1110 and the second guiding structures 1210 until the first electrical connector 111 and the second electrical connector 121 are aligned with each other. For example, as shown in FIG. 11, there is the displacement ΔX of the first electrical connector 111 relative to the second electrical connector 121 along the second direction X. When it is desired to connect the first electrical connector 111 and the second electrical connector 121, the second electrical connector 121 and the second circuit board 120 are driven by the first electrical connector 111 to move relative to the back cover 123 along the second direction X to a position as shown in FIG. 10, so that the second circuit board 120 is driven to press the first resilient component 171 to be deformed along the second direction X until the moving distances of the second electrical connector 121 and the second circuit board 120 along the second direction X are equal to the displacement ΔX of the first electrical connector 111 relative to the second electrical connector 121 along the second direction X. In such a way, it reduces the stress between the first electrical connector 111 and the second electrical connector 121 and further prevents contact fault, such as solder joint cracks, between the first electrical connector 111 and the first circuit board 110 and between the second electrical connector 121 and the second circuit board 120, due to the pulling and dragging of the first electrical connector 111 and the second electrical connector 121, which ensures that the electronic device 1 can operate normally. On the other hand, when the first electrical connector 111 is operated to separate from the second electrical connector 121, the pressed first resilient component 171 can drive the second electrical connector 121 and the second circuit board 120 to recover along the second direction X by a generated resilient covering force. Therefore, it ensures the second electrical connector 121 can be connected to another electrical connector of another electronic module, which is not affected by the previous moving distance.

Figure 12:
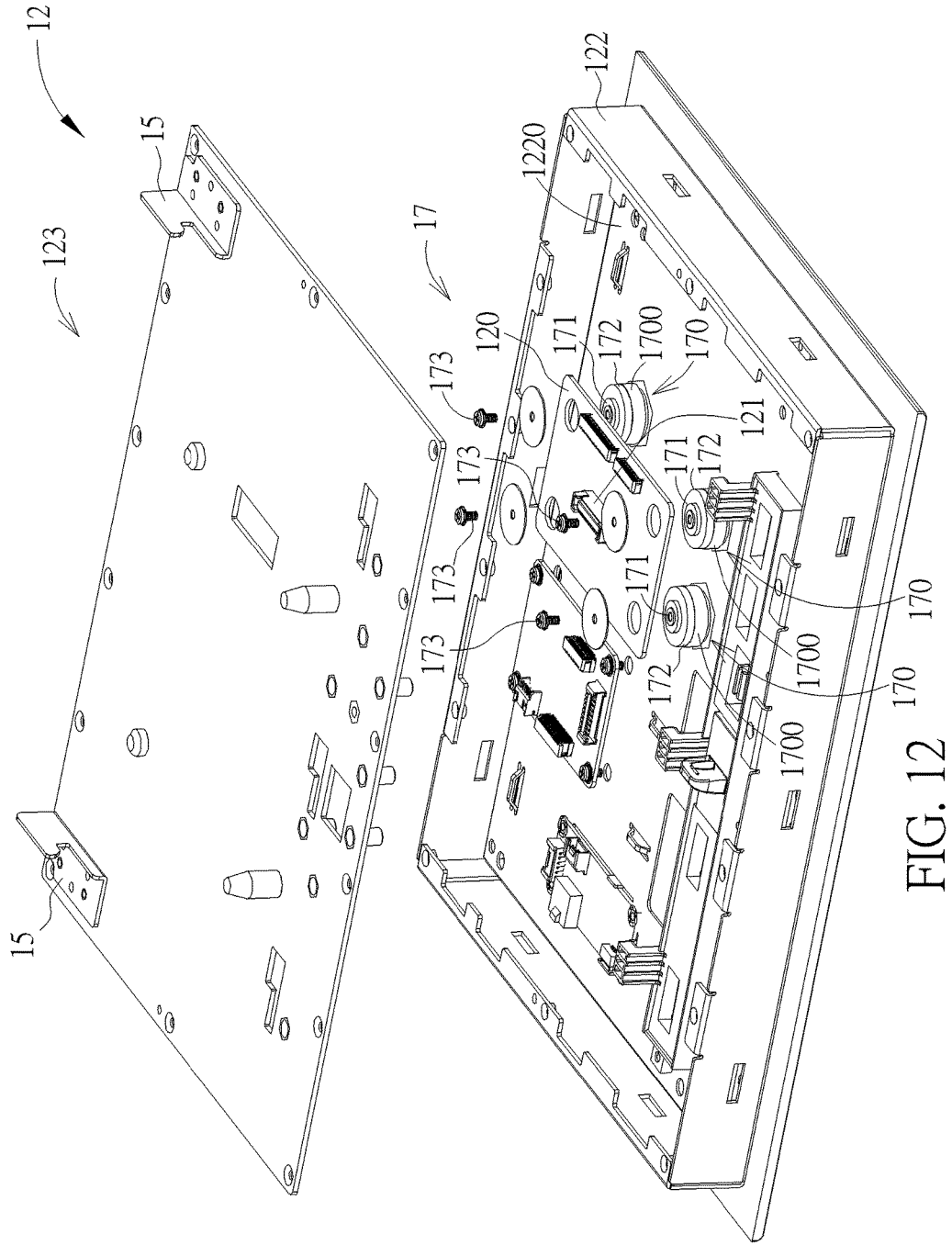
FIG. 12 is a partial exploded diagram of a second electronic module according to a second embodiment of the present disclosure.

However, structure of the shock absorbing structure 17 of the present disclosure is not limited to that illustrated in the figures of the first embodiment. It depends on practical demands. For example, please refer to FIG. 12. FIG. 12 is a partial exploded diagram of the second electronic module 12 according to a second embodiment of the present disclosure. As shown in FIG. 12, different from the first embodiment, the second circuit board 120 of the second embodiment is installed on the display assembly 122. Therefore, the fixing portions 1700 of the protruding columns 170 are fixed onto an inner side 1220 of the display assembly 122 of the second electronic module 12. The shock absorbing structure 17 is disposed between the second circuit board 120 and the display assembly 122 correspondingly, so that the second circuit board 120 can move relative to the display assembly 122 of the second electronic module 12 for reducing the stress between the first electrical connector 111 and the second electrical connector 121. Furthermore, in another embodiment, the shock absorbing structure 17 also can be disposed between the first circuit board 110 and the housing 112, so that the first circuit board 110 can move relative to the housing 112 to compensate a misalignment between the first electrical connector 111 and the second electrical connector 121 caused by assembly error, which reduces a stress between the first electrical connector 111 and the second electrical connector 121 when the first electrical connector 111 is connected to the second electrical connector 121. In other words, structures which can facilitate the circuit board to move relative to the housing 112 for reducing the stress between the electrical connectors when the electrical connectors are connected to each other are within the scope of the disclosure.

In contrast to the prior art, in the present disclosure, no matter when the first electrical connector and the second electrical connector, which are connected to each other, are affected by the external impact to vibrate or when the first electrical connector and the second electrical connector are not aligned with each other due to assembly error before connection, the second circuit board can be driven to move along the first direction and/or the second direction to press the second resilient component and/or the first resilient component for reducing the stress between the first electrical connector and the second electrical connector, which prevents contact fault, such as solder joint cracks, between the first electrical connector and the first circuit board and between the second electrical connector and the second circuit board, due to the pulling and dragging force of the first electrical connector and the second electrical connector, and ensures that the electronic device can operate normally. Furthermore, when the first electrical connector separates from the second electrical connector, the pressed first resilient component and/or the pressed second resilient component can drive the second circuit board and the second electrical connector to recover. Therefore, it ensures the second electrical connector can be connected to another electrical connector of another electronic module, which is not affected by the previous moving distance.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A shock absorbing structure adapted for a circuit board of an electronic device, the shock absorbing structure comprising:
   at least one protruding column fixed on the electronic device and passing through the circuit board, the at least one protruding column comprising a fixing portion and a protruding portion connected to the fixing portion, the fixing portion being fixed onto the electronic device, and the protruding portion passing through the circuit board; and
   at least one resilient module disposed between the at least one protruding column and the circuit board, the at least one resilient module comprising a first resilient component and a second resilient component, the first resilient component being sleeved on the protruding portion and passing through the circuit board, a side of the first resilient component abutting against the fixing portion, and the second resilient component being sleeved on the first resilient component and abutting between the fixing portion and the circuit board;
   wherein when the electronic device is forced to vibrate by an external impact, the circuit board presses the at least one resilient module, so that the at least resilient module is deformed to generate a resilient force, the resilient force drives the circuit board to recover when the circuit board does not press the at least one resilient module, the second resilient component is pressed to be deformed by the circuit board when the circuit board moves along a first direction, and the first resilient component is pressed to be deformed by the circuit board when the circuit board moves along a second direction perpendicular to the first direction.

2. The shock absorbing structure of claim 1, further comprising:
   at least one fastening component fastened onto the at least one protruding column; and
   at least one washer disposed between the at least one fastening component and the at least one protruding column, a gap being formed between the at least one resilient module and the at least one washer, and the circuit board being disposed between the at least one washer and the at least one resilient module.

3. The shock absorbing structure of claim 1, further comprising:
   at least one fastening component fastened onto the protruding portion of the at least one protruding column; and
   at least one washer disposed between the at least one fastening component and the protruding portion of the at least one protruding column, a gap being formed between the first resilient component and the at least one washer, and the circuit board being disposed between the at least one washer and the second resilient component.

4. The shock absorbing structure of claim 3, wherein a height of the protruding portion along the first direction is greater than a height of the first resilient component along the first direction.

5. The shock absorbing structure of claim 4, wherein a sum of a height of the second resilient component along the first direction and a height of the circuit board along the first direction is less than the height of the protruding portion along the first direction.

6. The shock absorbing structure of claim 1, wherein the protruding portion protrudes from the fixing portion, an inner periphery of the first resilient component is sleeved on and at least partially covers the protruding portion, the second resilient component is sleeved on and partially covers an outer periphery of the first resilient component opposite to the inner periphery of the first resilient component.

7. An electronic device comprising:
   a first electronic module comprising a first circuit board and a first electrical connector;
   a second electronic module comprising a second circuit board and a second electrical connector; and
   a shock absorbing structure for reducing a stress between the first electrical connector and the second electrical connector when the first electrical connector is connected with the second electrical connector, the shock absorbing structure comprising:
      at least one protruding column fixed on the second electronic module and passing through the second circuit board, the at least one protruding column comprising a fixing portion and a protruding portion connected to the fixing portion, the fixing portion being fixed onto the second electronic module, and the protruding portion passing through the second circuit board; and at least one resilient module disposed between the at least one protruding column and the second circuit board, the at least one resilient module comprising a first resilient component and a second resilient component, the first resilient component being sleeved on the protruding portion and passing through the second circuit board, a side of the first resilient component abutting against the fixing portion, and the second resilient component being sleeved on the first resilient component and abutting between the fixing portion and the second circuit board;

wherein when the electronic device is forced to vibrate by an external impact, the second circuit board presses the at least one resilient module, so that the at least resilient module is deformed to generate a resilient force, the resilient force drives the second circuit board to recover when the second circuit board does not press the at least one resilient module, the second resilient component is pressed to be deformed by the second circuit board when the second circuit board moves along a first direction, and the first resilient component is pressed to be deformed by the second circuit board when the second circuit board moves along a second direction perpendicular to the first direction.

8. The electronic device of claim 7, wherein the shock absorbing structure further comprises:

at least one fastening component fastened onto the at least one protruding column; and at least one washer disposed between the at least one fastening component and the at least one protruding column, a gap being formed between the at least one resilient module and the at least one washer, and the second circuit board being disposed between the at least one washer and the at least one resilient module.

9. The electronic device of claim 7, wherein the shock absorbing structure further comprises:

at least one fastening component fastened onto the protruding portion of the at least one protruding column; and at least one washer disposed between the at least one fastening component and the protruding portion of the at least one protruding column, a gap being formed between the first resilient component and the at least one washer, and the second circuit board being disposed between the at least one washer and the second resilient component.

10. The electronic device of claim 9, wherein a height of the protruding portion along the first direction is greater than a height of the first resilient component along the first direction.

11. The electronic device of claim 10, wherein a sum of a height of the second resilient component along the first direction and a height of the circuit board along the first direction is less than the height of the protruding portion along the first direction.

12. The electronic device of claim 7, wherein the protruding portion protrudes from the fixing portion, an inner periphery of the first resilient component is sleeved on and at least partially covers the protruding portion, the second resilient component is sleeved on and partially covers an outer periphery of the first resilient component opposite to the inner periphery of the first resilient component.

13. The electronic device of claim 7, further comprising at least one first positioning structure and at least one second positioning structure, the at least one first positioning structure being disposed on the first electronic module, the at least one second positioning structure being disposed on the second electronic module, and the first electronic module and the second electronic module being aligned with each other by cooperation of the at least one first positioning structure and the at least one second positioning structure.

14. The electronic device of claim 7, further comprising two fixing brackets and two fixing rods, the two fixing brackets being disposed on two sides of the second electronic module, a fixing slot being formed on each of the two fixing brackets, the two fixing rods being disposed on two sides of the first electronic module and located at positions corresponding to the two fixing brackets, the first electronic module being pivotally connected to the second electronic module by engagement of the two fixing rods and the two fixing slots on the two fixing brackets, and the first electronic module being allowed to separate from the second electronic module by disengagement of the two fixing rods and the two fixing slots on the two fixing brackets.

15. The electronic device of claim 7, wherein the second electronic module further comprises a display assembly and a back cover covering the display assembly, and the second circuit board is installed on the display assembly or on an inner side of the back cover facing the display assembly.

* * * * *